United States Patent
Janak et al.

(10) Patent No.: US 10,236,232 B2
(45) Date of Patent: Mar. 19, 2019

(54) DUAL-USE THERMAL MANAGEMENT DEVICE

(71) Applicants: Chris Janak, Austin, TX (US); Sukesh Shenoy, Austin, TX (US)

(72) Inventors: Chris Janak, Austin, TX (US); Sukesh Shenoy, Austin, TX (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 4 days.

(21) Appl. No.: 15/409,758

(22) Filed: Jan. 19, 2017

(65) Prior Publication Data

US 2018/0206326 A1   Jul. 19, 2018

(51) Int. Cl.
| | |
|---|---|
| *H01L 23/34* | (2006.01) |
| *H01L 23/427* | (2006.01) |
| *H01L 21/48* | (2006.01) |
| *H01L 23/367* | (2006.01) |

(52) U.S. Cl.
CPC .......... *H01L 23/34* (2013.01); *H01L 21/4882* (2013.01); *H01L 23/427* (2013.01); *H01L 23/367* (2013.01)

(58) Field of Classification Search
CPC .......... H05K 9/00; H05K 1/0203; H05K 3/22; H05K 2201/10515; H01L 2924/0002; H01L 2924/00; H01L 23/4006; F28D 2015/0216
USPC .......... 361/719, 704, 707, 818, 697, 679.46; 257/727
See application file for complete search history.

(56) References Cited

U.S. PATENT DOCUMENTS

| | | | | |
|---|---|---|---|---|
| 6,002,168 A | * | 12/1999 | Bellaar | H01L 23/49816 257/693 |
| 6,075,699 A | * | 6/2000 | Rife | H01L 23/4093 165/80.2 |
| 6,205,026 B1 | * | 3/2001 | Wong | H01L 23/4093 165/80.3 |
| 6,219,239 B1 | | 4/2001 | Mellberg et al. | |
| 6,278,615 B1 | | 8/2001 | Brezina et al. | |
| 6,317,328 B1 | | 11/2001 | Su | |
| 6,377,474 B1 | | 4/2002 | Archambeault et al. | |
| 6,396,699 B1 | | 5/2002 | Caldwell et al. | |
| 6,472,742 B1 | * | 10/2002 | Bhatia | H01L 23/40 257/706 |
| 6,606,246 B2 | | 8/2003 | Wells | |
| 6,643,137 B1 | * | 11/2003 | Chung | H01L 23/367 165/185 |
| 7,164,587 B1 | | 1/2007 | Garnett et al. | |

(Continued)

OTHER PUBLICATIONS https://www.allhdd.com/processor/intel-core-i7/2.66ghz/slbpd-intel-previous-generation-core-i7-620m-2.66ghz-4mb-smart-cache-2.5gt-s-dmi-speed-32nm-35w-socket-pga-988-mobile-processor.-new-bulk-pack./?src=ggl&gclid=Cj0KCQiAgs7RBRDoARIsANOo-Hi0Rc2YCm8dqKa9oGm0rZ_HbuxGZql ixszGMEe8hB-9zAc3EC47QGEaAt6sEALw_wcB.*

*Primary Examiner* — Mandeep S Buttar
(74) *Attorney, Agent, or Firm* — Timothy M. Honeycutt

(57) ABSTRACT

Various thermal management devices for providing thermal management of integrated circuit chips are disclosed. In one aspect, a thermal management device is provided that has a heat spreader plate that includes mechanical connection structures to enable the heat spreader plate to mount on a first circuit board and thermally contact the integrated circuit chip when the integrated circuit chip is directly mounted on the first circuit board and to enable the heat spreader plate to mount on a second circuit board having a socket and (Continued)

thermally contact the integrated circuit chip when the integrated circuit chip is mounted in the socket.

18 Claims, 5 Drawing Sheets

(56) References Cited

U.S. PATENT DOCUMENTS

| | | |
|---|---|---|
| 7,327,577 B2 | 2/2008 | Gilliland et al. |
| 7,990,713 B2 * | 8/2011 | Liu ..................... F28D 15/0233 165/104.33 |
| 2002/0090843 A1 * | 7/2002 | Chien ................... H01L 21/568 439/71 |
| 2004/0095730 A1 | 5/2004 | Youm et al. |
| 2004/0257786 A1 | 12/2004 | Murasawa |
| 2007/0058343 A1 | 3/2007 | Deng et al. |
| 2007/0272395 A1 * | 11/2007 | Hwang ................. H01L 23/427 165/104.33 |
| 2010/0157541 A1 * | 6/2010 | Zhu .......................... F28F 3/02 361/710 |
| 2015/0201533 A1 | 7/2015 | Daughtry, Jr. et al. |

\* cited by examiner

DUAL-USE THERMAL MANAGEMENT DEVICE

BACKGROUND OF THE INVENTION

1. Field of the Invention

This invention relates generally to computing devices, and more particularly to thermal solutions for computing devices.

2. Description of the Related Art

In various types of electronic systems, microprocessors and sometimes other types of integrated circuits are often connected to some form of larger printed circuit board, such as a motherboard, daughterboard or other type of a printed circuit board. In some cases, the integrated circuit is connected to the motherboard by direct soldering or other direct mounting techniques. In other cases, a socket is provided on the upper surface of the motherboard that is designed to receive the integrated circuit. For those integrated circuits that consist of some type of package enclosure and some plurality of conductor pins that project from the package, the motherboard socket includes a corresponding plurality (pin grid array or PGA) of individual socket holes that are arranged spatially to match up with corresponding conductor pins on the integrated circuit package. Ball grid array and land grid array integrated circuit packages require circuit board sockets with correspondingly different types of interconnects.

Packaged integrated circuits usually undergo package level testing prior to mounting to an operational board. Such testing is performed on a test board and frequently with a test socket appropriate for the particular package, e.g., PGA, BGA or LGA. The packaged part is mounted on the test socket and subjected to various diagnostics. Depending on the power dissipation of the integrated circuit and the duration and intensity of testing, a thermal solution will be required to cool the integrated circuit during testing. If the part passes the socket test, the thermal solution is moved off the integrated circuit and the next part is inserted and so on.

A difficulty associated with conventional thermal solutions is that thermal solutions used on test sockets are different than the thermal solutions suitable for and actually used on production boards where the integrated circuit is either soldered down (BGA parts) or assembled into a production socket (LGA for example). These different thermal solutions may cause difficulty in correlating thermal parameters as the thermal behavior of each thermal solution (i.e., testing versus production) is very different in both cases. Current techniques rely on some guesswork to extend thermal testing data from a test socket thermal solution to a production board thermal solution.

The present invention is directed to overcoming or reducing the effects of one or more of the foregoing disadvantages.

SUMMARY OF THE INVENTION

In accordance with one aspect of the present invention, a thermal management device is provided that has a heat spreader plate that includes mechanical connection structures to enable the heat spreader plate to mount on a first circuit board and thermally contact the integrated circuit chip when the integrated circuit chip is directly mounted on the first circuit board and to enable the heat spreader plate to mount on a second circuit board having a socket and thermally contact the integrated circuit chip when the integrated circuit chip is mounted in the socket.

In accordance with another aspect of the present invention, a method of thermally managing an integrated circuit chip positioned on a first circuit board or on a socket of a second circuit board is provided. The method includes, when the integrated circuit chip is directly mounted on the first circuit board, placing a heat spreader plate in thermal contact with the integrated circuit chip. The heat spreader plate includes mechanical connection structures to enable the heat spreader plate to mount on the first circuit board and thermally contact the integrated circuit chip. Or when the integrated circuit chip is mounted on the socket of the second circuit board, placing the heat spreader plate in thermal contact with the integrated circuit chip and using the mechanical connection structures to mount the heat spreader plate on the socket.

In accordance with another aspect of the present invention, a method of manufacturing a device for thermally managing an integrated circuit chip is provided. The method includes fabricating a heat spreader plate to thermally contact the integrated circuit chip and coupling mechanical connection structures to the heat spreader plate. The mechanical connection structures enable the heat spreader plate to mount on a first circuit board and thermally contact the integrated circuit chip when the integrated circuit chip is directly mounted on the first circuit board and enable the heat spreader plate to mount on a second circuit board having a socket and thermally contact the integrated circuit chip when the integrated circuit chip is mounted in the socket.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

Various dual-use thermal management devices for providing thermal management of integrated circuit chips mounted to a circuit board with or without a socket are disclosed. The thermal management device includes mechanical connection structures to either mount to a circuit board by way of a socket (a first use) or to a circuit board without resort to a socket (a second use). Additional details will now be described.

Figure 1:
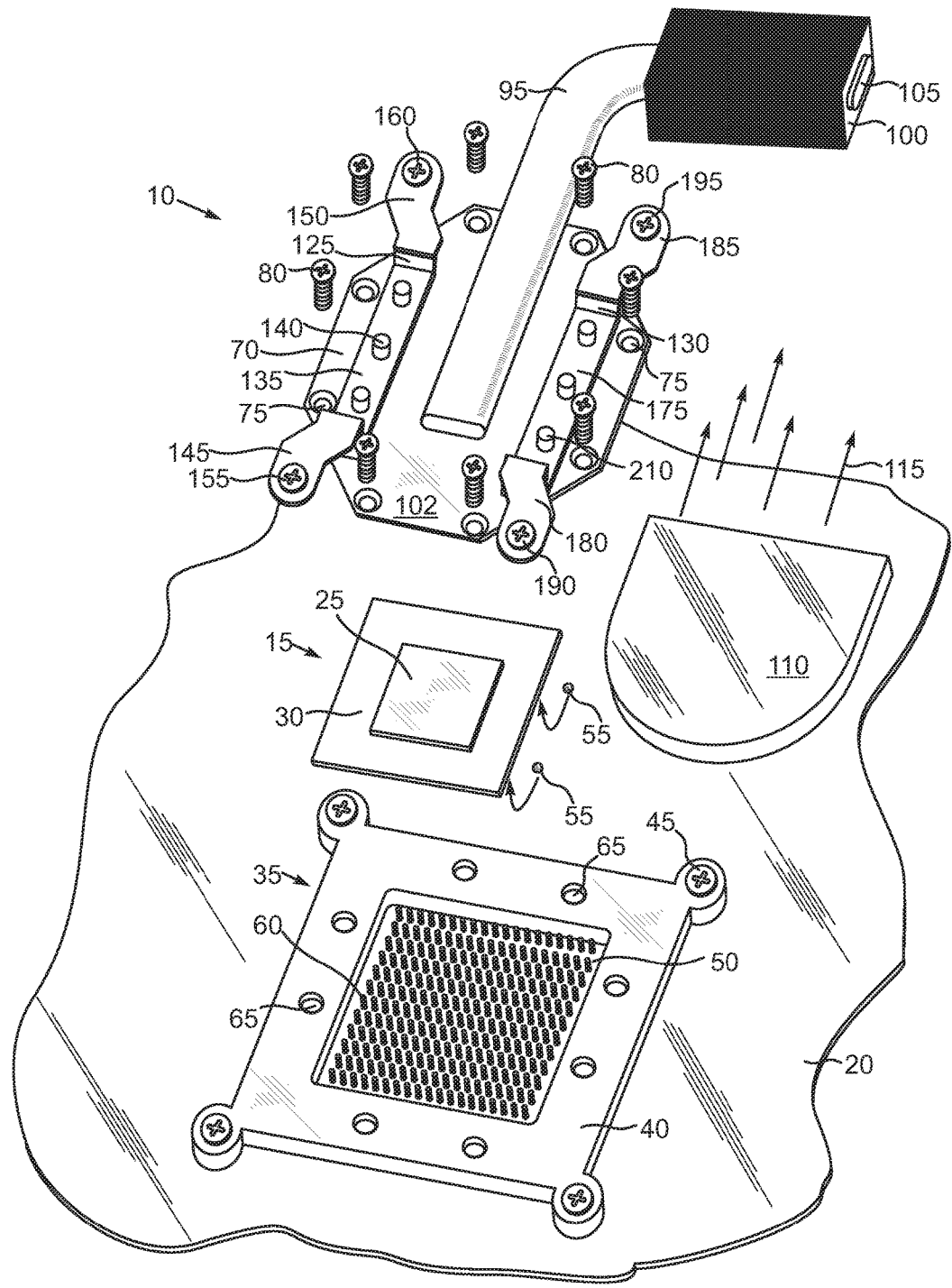
FIG. 1 is a partially exploded pictorial view of an exemplary embodiment of a thermal management device that may be used to provide thermal management for an integrated circuit.

In the drawings described below, reference numerals are generally repeated where identical elements appear in more than one figure. Turning now to the drawings, and in particular to FIG. 1, therein is depicted a partially exploded pictorial view of a thermal management device 10 that may be used to provide thermal management for an integrated circuit chip 15. The integrated circuit 15 and the thermal management device 10 are both shown exploded from a circuit board 20, only a portion of which is depicted. The integrated circuit 15 may be a packaged device as shown and thus include one or more integrated circuit chips 25 mounted on a circuit board 30, such as a package substrate. The integrated circuit chip(s) 25 may be any of a large number of different types of circuit devices used in electronics, such as, for example, microprocessors, graphics processors, combined microprocessor/graphics processors, application specific integrated circuits, memory devices or the like, and may be single or multi-core or even stacked with or accompanied by additional dice. The integrated circuit chip(s) 25 may be constructed of bulk semiconductor, such as silicon or germanium, or semiconductor-on-insulator materials, such as silicon-on-insulator materials or other semiconductor or other materials.

The circuit board 30 may interface electrically with the circuit board 20 by way of a socket 35. The socket 35 may include a socket housing 40 that is mounted to the circuit board 20 by way of fasteners 45, which may be screws, rivets or other fasteners. The socket housing 40 is advantageously composed of electrically insulating materials, such as liquid crystal polymer, fiberglass resin materials, well-known plastics or the like. The socket housing 40 includes an array of interconnects 50 which are designed to electrically interface with electrical interconnects of the circuit board 30. The electrical interconnects of the circuit board 30 may be solder balls 55 as depicted or other types of interconnects, such as pins or lands in the event of a pin grid array or land grid array type arrangement or even other interconnects are possible. In any event, the array of interconnects 50 may be positioned in a cavity 60 of the socket housing 40. The socket 35 may be a test socket or a production socket as desired. Note that the socket housing 40 may be provided with plural fastener holes 65, which may be threaded bores to receive screws or other threaded fasteners or holes for rivets or types of fastening devices. As described in more detail below, the fastener holes 65 are designed to receive fasteners to secure the thermal management device 10 to the socket 35.

Figure 2:
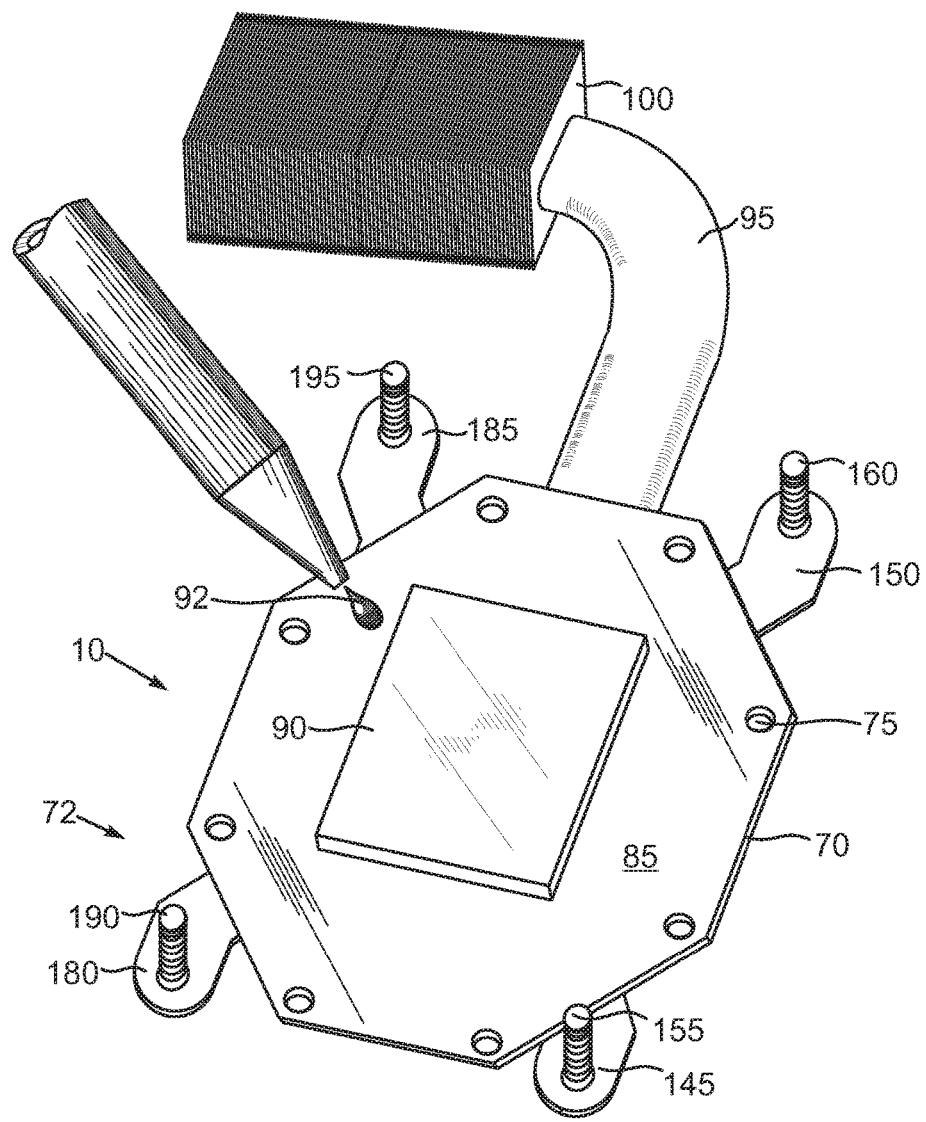
FIG. 2 is a pictorial view of the exemplary thermal management device flipped over from the orientation in FIG. 1.

Additional details of the thermal management device 10 will now be described in conjunction with FIG. 1 and also FIG. 2, which is a pictorial view of the thermal management device 10 flipped from the orientation shown in FIG. 1. The thermal management device 10 may include a heat spreader plate 70 that is designed to mount to either the socket 35 or directly to the circuit board 20 in an embodiment to be described and shown below. To facilitate mounting to the socket 35 (and to a circuit board without resort to a socket), the heat spreader plate 70 may include plural mechanical connection structures 72. Those structures of the mechanical connection structures 72 suitable for connection to a circuit board without resort to a socket will be described later. The mechanical connection structures 72 suitable for connection to the socket 35 may include plural fastener holes 75 spaced around the periphery of the heat spreader plate 70 with the same general footprint as the fastener holes 65 in the socket housing 40. Fasteners 80, making up a set of fasteners, may be screwed into the holes 75 when the plate 70 is seated on the socket housing 40 and secured in the fastener holes 65. In this illustrative embodiment, the fasteners 80 may be threaded screws, but the skilled artisan will appreciate that rivets or other types of fasteners may be used such as spring loaded screws or other types of screws. Here, the fastener holes 75 in the heat spreader plate 70 may be countersunk as depicted or not as desired. As shown in FIG. 2, the underside 85 of the heat spreader plate 70 may be provided with a thermal block 90 that is designed to establish a thermal pathway with the integrated circuit chip 25 directly or with the assistance of a thermal interface material 92, which may be a thermal grease, gels or other thermal interface materials. The thermal block 90 may have the same general footprint as the integrated circuit chip 25 but is preferably larger in footprint than the integrated circuit chip 25. The heat spreader plate 70 and the thermal block 90 may be integrally formed, that is, machined, cast, forged or otherwise from a single piece of metal or may be separately fabricated and thereafter joined. For example, the thermal block 90 could be constructed separately from the plate 70 and thereafter secured to the plate 70 by soldering, welding, brazing or other metal joining techniques. The heat spreader plate 70, including the thermal block 90, may be composed of a variety of materials suitable for heat spreaders, such as, copper, aluminum or others. Here, the heat spreader plate 70 has a generally octagonal footprint. However the skilled artisan will appreciate that the heat spreader plate 70 may have virtually any footprint that is capable of being seated on the socket housing 40 to enhance the heat transfer properties of the thermal management device 10.

A heat pipe(s) 95 may be connected to the heat spreader plate 70, and in turn, to plural heat fins 100. Here, the heat pipe(s) may be connected to an upper surface 102 of the heat spreader plate 70, but other positions are possible. The heat pipe(s) 95 may be virtually any shape as desired. For example, the internal layouts of various computing devices can vary greatly and thus the available spaces to accommodate the heat fins 100 and the heat pipe 95 may be highly variable. Thus, the heat pipe 95 and the heat fins 100 may be fashioned in a large variety of different shapes and sizes in order to accommodate the available internal spaces of a computing device. If configured as a true heat pipe, the heat pipe 95 may include an internal space (not visible) that contains a small volume of a heat transfer liquid such as water, glycol or other materials. The heat pipe 95 and the heat fins 100 may be composed of a variety of heat sink materials such as copper, aluminum or other materials. Note that one end 105 of the heat pipe 95 may project from the heat fins 100 as shown. The heat pipe 95 may be coupled to the heat spreader plate 70 in a variety of ways such as by soldering, adhesives, brackets or other fixtures not depicted or other methods. Note that the heat pipe 95 and the heat fins 100 may be arranged, sized and shaped so that the heat fins 100 may be positioned adjacent to a cooling fan 110 mounted on or near the circuit board 20 and thus be operable to have cooling air 115 passed over and around the heat fins 100.

The thermal management device 10 also includes mechanical connection structures 72 to enable the heat spreader plate 70 to be mounted to a circuit board that does not include the socket 35 but is rather designed more specifically for a direct mount of the integrated circuit 15 to a circuit board. In this regard, attention is now turned also to FIG. 3, which is an exploded pictorial view of the thermal management device 10 and another circuit board 20' that does not include a socket, such as the socket 35, but is instead designed for a direct mounting of the integrated circuit 15. To secure the heat spreader plate 70 to hardware other than the socket 35 depicted in FIG. 1, such as the mounting hardware 120 depicted in FIG. 3, the mechanical connection structures 72 may include a pair of mounting arms 125 and 130 mounted on the upper surface 102 of the heat spreader plate 70 in a spaced-apart relation as shown. The mounting arm 125 consists of a base portion 135 that is seated on the upper surface 102 of the heat spreader plate 70 and secured thereto by the depicted pegs 140, which project up through respective holes in the base portion 135 with an interference fit so as to secure the mounting arm 125 to the upper surface 102. Optionally, other types of fasteners such as screws, rivets or even solder or welding can be used to secure the mounting arm 125 to the upper surface 102. The mounting arm 125 includes oppositely-positioned connection brackets 145 and 150 that are elevated above the base portion 135 and may be provided with respective fasteners 155 and 160. The fasteners 155 and 160 are designed to project into mounting holes 165 and 170 of the mounting hardware 120 on the circuit board 20' shown in FIG. 3. The fasteners 155 and 160 may be screws, rivets, with spring bias screws or other types of fasteners as desired. The mounting arm 130 may be configured like the mounting arm 125, albeit as a mirror image, and thus include a base portion 175 and elevated connection brackets 180 and 185 and respective fasteners 190 and 195 that are designed to engage fastener holes 200 and 205 of the mounting hardware 120 of the circuit board 20'. The fasteners 155, 160, 190 and 195 may make up another set of fasteners. In addition, the base portion 175 may be mounted to the upper surface 102 of the heat spreader plate 70 by way of pegs 210, which may be like the pegs 140 or the above-described alternatives. The mounting arms 125 and 130 may be constructed of a variety of materials, such as stainless steel, copper, aluminum, plastics or the like. The connection brackets 145, 150, 180 and 185 are elevated relative to the base portions 135 and 175 to accommodate the height of the mounting hardware 120 and so that when the fasteners 155, 160, 190 and 195 engage the mounting hardware 120, a spring force is exerted on the spreader plate 70, and in-turn, the integrated circuit 15.

Figure 3:
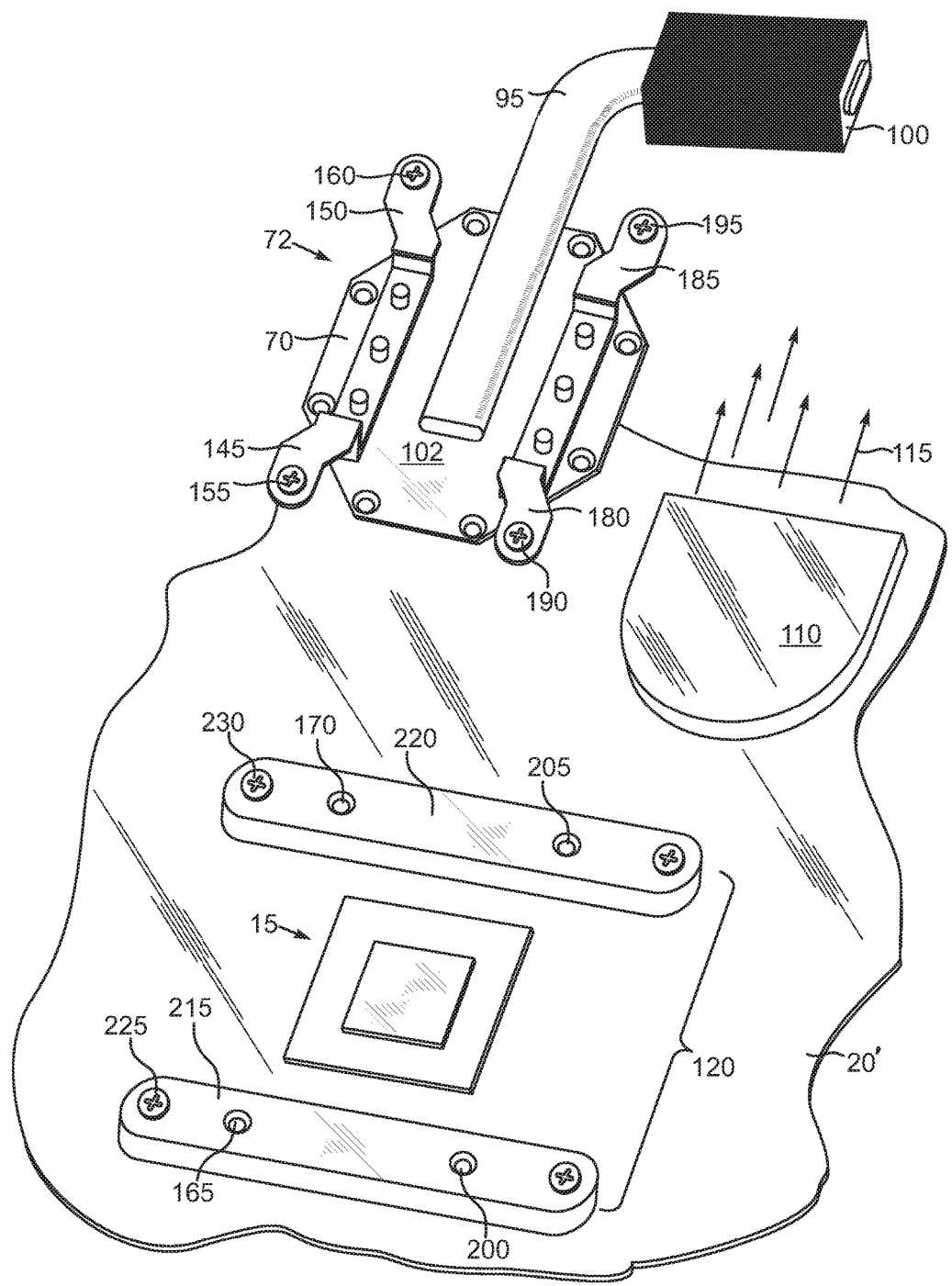
FIG. 3 is a partially exploded pictorial view like FIG. 1, but depicting an alternate exemplary circuit board.

The mounting hardware 120 shown in FIG. 3 may be virtually any shape and size. In this illustrative embodiment, the mounting hardware 120 may include a retention frame 215 and another retention frame 220 spaced apart from the retention frame 215. The retention frame 215 may include the fastener holes 165 and 200 and the retention frame 220 may include the fastener holes 170 and 205. The retention frames 215 and 220 may be spaced apart such that the heat spreader plate 70 may seat thereon when the fasteners 155, 160, 190 and 195 are secured in the fastener holes 165, 200, 170 and 205. Optionally, the retention frames 215 and 220 may be spaced apart farther than what will allow the heat spreader plate 70 to seat thereon. In this circumstance, the stability of the heat spreader plate 70 will be determined by the tightness of the fasteners 155, 160, 190 and 195 and by whatever physical support may be provided by the heat spreader plate 70 seating on the integrated circuit 15. Note that the retention frames 215 and 220 may be virtually any shape so long as there are available fastener holes 165, 170, 200 and 205. In this illustrative embodiment, the retention frame 215 may be secured to the circuit board 20' by way of fasteners 225 which may be screws, rivets or other types of fasteners. Similarly, the retention frame 220 may be secured to the circuit board 20' by way of fasteners 230 which may be like the fasteners 225. The retention frames 215 and 220 may be composed of a variety of materials, such as copper, stainless steel, aluminum, well-known plastics or the like. As with the other circuit board 20 depicted in FIGS. 1 and 2, the circuit board 20' may include the aforementioned cooling fan 110, and the heat pipe 95 and the heat fins 100 may be sized and shaped to accommodate the position of the cooling fan 100 and the efficient reception of cooling air 115 therefrom.

Figure 4:
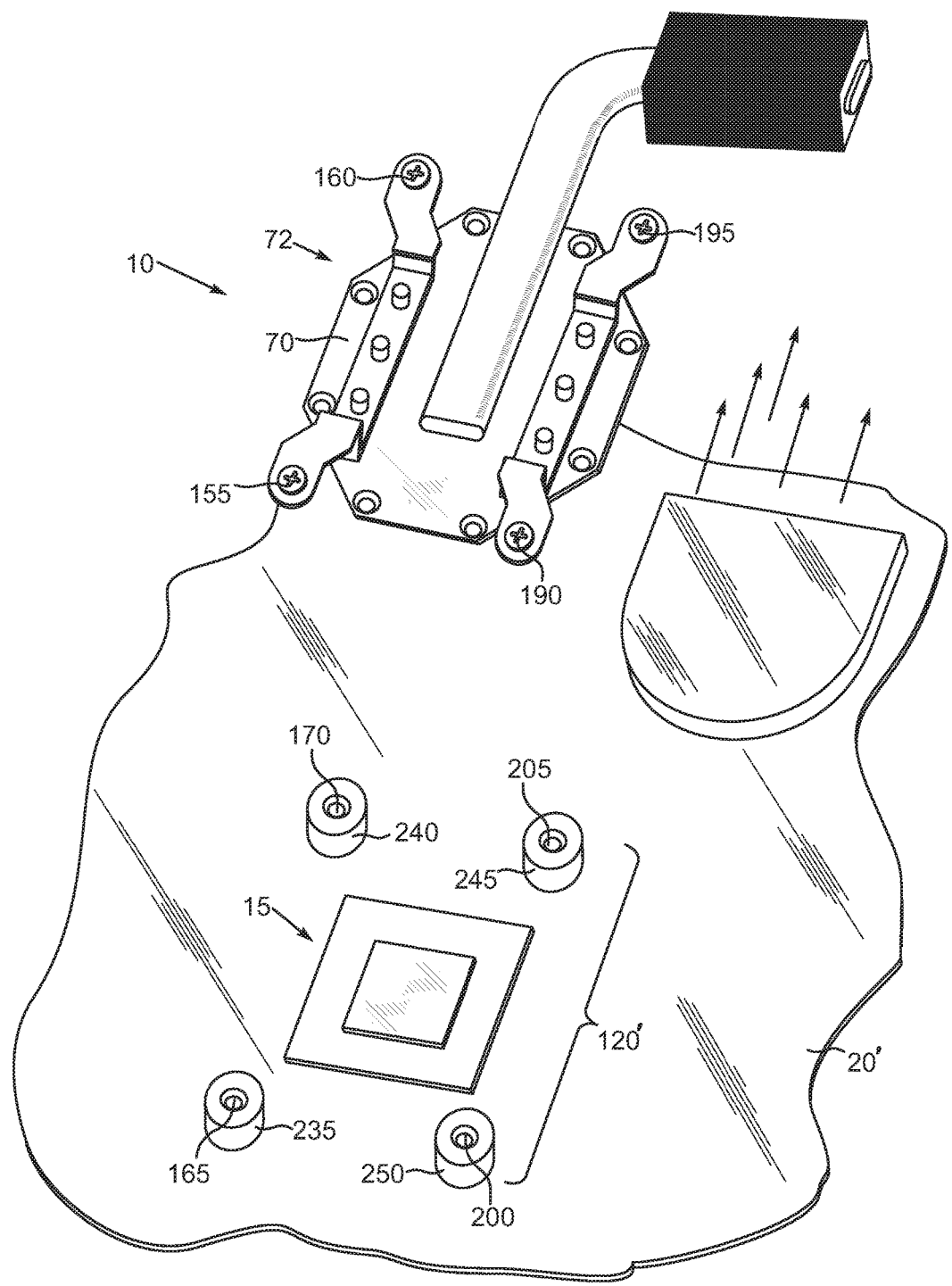
FIG. 4 is a partially exploded pictorial view like FIG. 3, but depicting another alternate exemplary circuit board.

It should be understood that the retention frames 215 and 220 could be replaced with other mounting hardware that enables mounting of the thermal management device 10. For example, FIG. 4 depicts a partially exploded pictorial view of the circuit board 20' outfitted with an alternate exemplary mounting hardware 120' that enables mounting the thermal management device 10 to the circuit board 20'. In this illustrative embodiment, the mounting hardware 120' includes four mounting posts 235, 240, 245 and 250 that include the fastener holes 165, 170, 200 and 205, respectively. When the heat spreader plate 70 is positioned on the integrated circuit 15, the fasteners 155, 160, 190 and 195 may be engaged with the fastener holes 165, 170, 200 and 205, respectively. The mounting posts 235, 240, 245 and 250 may be constructed of the same types of materials as the retention frames 210 and 220 shown in FIG. 3.

Figure 5:
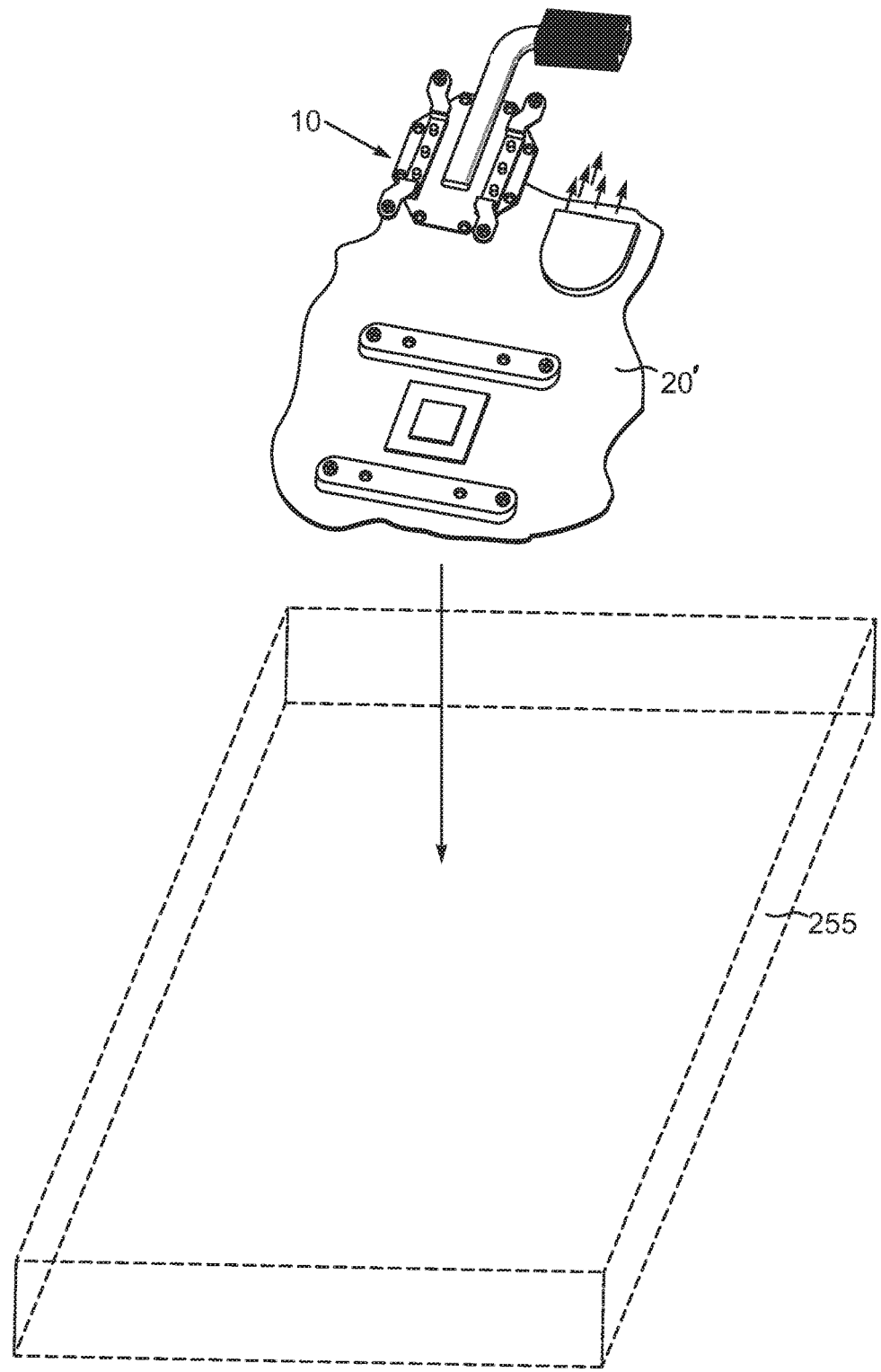
FIG. 5 is a pictorial view depicting an exemplary circuit board and thermal management device exploded from an electronic device.

As shown in FIG. 5, the circuit board 20' (or any disclosed alternatives) may be mounted in a computing device 255. The computing device or system 255 may be a tablet computer, a notebook computer, a smart phone, a general purpose computer, a digital television, a handheld mobile device, a server, a memory device, an add-in board such as a graphics card, or any other computing device employing semiconductors. Other options include testing apparatus, such as probe testers, or virtually any other type of diagnostic apparatus.

It should be understood that because the thermal management device 10 is capable of providing thermal management for both a socket mounted integrated circuit and a direct mounted integrated circuit, the thermal management device 10 could be used in one instance for one type of application and thereafter removed and placed on another type of circuit board. For example, the thermal management device 10 as shown in FIGS. 1 and 2 may be mounted on the circuit board 20 that includes the socket 35 and the integrated circuit 15 positioned therein for testing purposes or even operational purposes. Thereafter, the thermal management device 10 may be removed from the socket 35 and the circuit board 20 and placed on the circuit board 20' to provide thermal management for a system where the integrated circuit 15 is direct mounted to the circuit board 20' or vice versa. Thus, the thermal management device 10 may be used with a common design but for both testing purposes and operational purposes for both a socketed design and a direct mount design as desired.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A thermal management device, comprising:
   a heat spreader plate including mechanical connection structures to enable the heat spreader plate to mount on a first circuit board and thermally contact an integrated circuit chip mounted on a second circuit board when the second circuit board is directly mounted on the first circuit board and to enable the heat spreader plate to mount on a third circuit board having a socket and thermally contact the integrated circuit chip when the second circuit board is mounted in the socket when the second circuit board is not directly mounted on the first circuit board; and wherein the mechanical connection structures comprise a first set of fasteners to connect to the first circuit board and a second set of fasteners to connect to the socket.

2. The thermal management device of claim 1, wherein the heat spreader plate comprises first and second spaced apart mounting arms, each of the mounting arms having some of the first set of fasteners.

3. The thermal management device of claim 1, wherein the second set of fasteners comprise screws.

4. The thermal management device of claim 1, wherein the heat spreader plate comprises a thermal block projecting away from an underside of the heat spreader plate to thermally contact the integrated circuit chip.

5. The thermal management device of claim 1, comprising a heat pipe coupled to the heat spreader plate and plural heat fins coupled to the heat pipe.

6. The thermal management device of claim 1, wherein the socket comprises a test socket.

7. The thermal management device of claim 1, comprising an electronic device, the first circuit board or the third circuit board and the heat spreader plate being mounted in the electronic device.

8. A method of thermally managing an integrated circuit chip positioned on a first circuit board mounted on a second circuit board or on a socket of a third circuit board, comprising:
when the integrated circuit chip is directly mounted on the first circuit board placing a heat spreader plate in thermal contact with the integrated circuit chip, the heat spreader plate including mechanical connection structures to enable the heat spreader plate to mount on the first circuit board and thermally contact the integrated circuit chip and additional mechanical connection structures to enable the heat spreader plate to mount on the socket of the third circuit board, and using the mechanical connection structures to mount the heat spreader plate on the first circuit board, or when the integrated circuit chip is mounted on the socket of the third circuit board placing the heat spreader plate in thermal contact with the integrated circuit chip and using the additional mechanical connection structures to mount the heat spreader plate on the socket; and
wherein the mechanical connection structures comprise a first set of fasteners to connect to the second circuit board and the additional mechanical connection structures comprise a second set of fasteners to connect to the socket.

9. The method of claim 8, wherein the heat spreader plate comprises first and second spaced apart mounting arms, each of the mounting arms having some of the first set of fasteners.

10. The method of claim 8, wherein the second set of fasteners comprise screws.

11. The method of claim 8, wherein the heat spreader plate comprises a thermal block projecting away from an underside of the heat spreader plate to thermally contact the integrated circuit chip.

12. The method of claim 8, comprising a heat pipe coupled to the heat spreader plate and plural heat fins coupled to the heat pipe.

13. The method of claim 8, wherein the socket comprises a test socket.

14. A method of manufacturing a device for thermally managing an integrated circuit chip mounted on a first circuit board, comprising:
fabricating a heat spreader plate to thermally contact the integrated circuit chip; and coupling mechanical connection structures to the heat spreader plate to enable the heat spreader plate to mount on a second circuit board and thermally contact the integrated circuit chip when the first circuit board is directly mounted on the second circuit board and to enable the heat spreader plate to mount on a third circuit board having a socket when the first circuit board is not directly mounted on the second board and thermally contact the integrated circuit chip when the integrated circuit chip is mounted in the socket; and
wherein the mechanical connection structures comprise a first set of fasteners to connect to the second circuit board and a second set of fasteners to connect to the socket.

15. The method of claim 14, wherein the mechanical connection structures comprise first and second spaced apart mounting arms, each of the mounting arms having some of the first set of fasteners.

16. The method of claim 14, wherein the second set of fasteners comprise screws.

17. The method of claim 14, comprising coupling a heat pipe to the heat spreader plate and plural heat fins to the heat pipe.

18. A thermal management device, comprising:
a heat spreader plate including mechanical connection structures to enable the heat spreader plate to mount on a first circuit board and thermally contact an integrated circuit chip mounted on a second circuit board when the second circuit board is directly mounted on the first circuit board and to enable the heat spreader plate to mount on a third circuit board having a socket and thermally contact the integrated circuit chip when the second circuit board is mounted in the socket when the second circuit board is not directly mounted on the first circuit board; and
wherein the socket has a first set of fastener holes with a first footprint and the mechanical connection structures comprise the heat spreader plate having a second set of fastener holes with the same general footprint as the first footprint.

\* \* \* \* \*